United States Patent

Takahashi

[15] 3,678,297

[45] July 18, 1972

[54] SWITCHING CIRCUIT

[72] Inventor: Susumu Takahashi, Tokyo, Japan

[73] Assignee: Sansui Electric Co., Ltd., Tokyo, Japan

[22] Filed: Feb. 17, 1971

[21] Appl. No.: 116,155

[30] Foreign Application Priority Data

Feb. 20, 1970 Japan....................................45/14451

[52] U.S. Cl...............................................................307/251
[51] Int. Cl..........................................................H03k 17/60
[58] Field of Search..................................307/251, 279, 304

[56] References Cited

UNITED STATES PATENTS 3,412,266 11/1966 Tarico....................................307/251
3,443,122 5/1969 Bowers..............................307/251 X
3,448,293 6/1969 Russell...................................307/251
3,495,097 2/1970 Abramson et al..................307/304 X
3,538,349 11/1970 Smith.................................307/251 X

*Primary Examiner*—John S. Heyman
*Attorney*—Flynn & Frishauf

[57] ABSTRACT

A switching circuit using a single field effect transistor for switching AC signals includes a junction type field effect transistor coupled in series with an AC signal circuit for selectively passing the AC signals from the source to the drain of said transistor. Circuit means supplies a constant gate voltage to the field effect transistor during the conductive period thereof, a voltage which is predetermined in accordance with the maximum magnitudes of the AC signals for forcing diode current to flow through at least one of the diode junctions of the field effect transistor such that the gate voltage follows the AC voltage applied to the source. A control circuit selectively renders the field effect transistor conductive or non-conductive as a function of the value of control signals, thereby switching the AC signals.

4 Claims, 2 Drawing Figures

SWITCHING CIRCUIT

Figure 1:
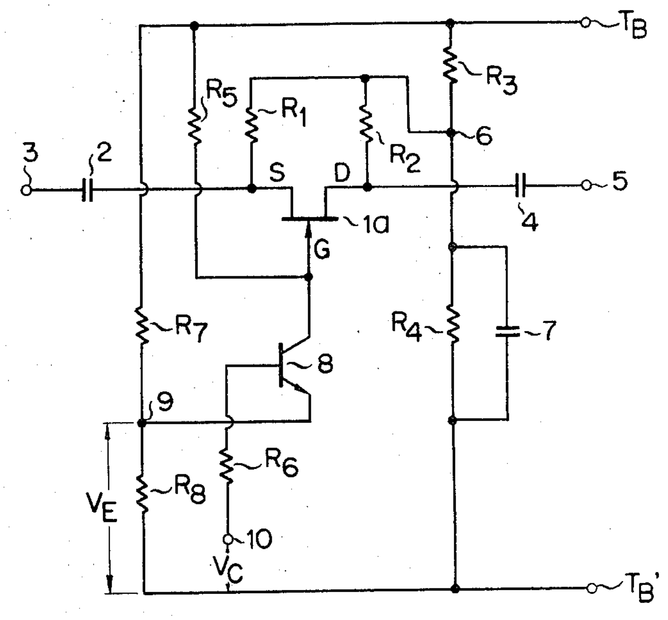

The present invention to improvements in a switching circuit including a field effect transistor.

With an FM receiving set, for example, detuning generally gives rise to large noises and causes discomfort to the user in selecting broadcasting stations. Therefore, it is desired that upon detuning, the output from a low or intermediate frequency amplifier circuit be stopped so as to prevent the occurrence of noises by connecting a switching circuit to said amplifier circuit. The circuit is generally called a muting circuit. With the prior art muting circuit in which there is used a field effect transistor (hereinafter referred to as "FET") as a switching element for said amplifier circuit, the gate potential is kept constant with respect to the ground when the FET is activated. Where, therefore, the potential across the source and drain of the FET varies according to the value of the voltage of signals to be transmitted to an output terminal, the potential across the gate and source thereof naturally changes. This means that the internal resistance of the FET changes, making it impossible to treat large signal voltages. Further, when signals pass through the FET under such condition, there most likely results the distortion of output signals.

It is accordingly the object of the present invention to provide a switching circuit capable of switching the supply of large signal voltage without giving rise to deformation of output signals.

INVENTION

The switching circuit of the present invention comprises an FET having its source and drain connected in series with an AC signal circuit so as to switch said signal circuit by control of its gate potential; a DC circuit for impressing proper voltage on the source, drain and gate of said FET for its activation and maintaining a potential difference between the source and gate, as well as between the drain and gate, at a prescribed level without fixing the gate potential while said fET is in conductive state; and means for switching said FET by varying its gate potential according to control signals for switching said AC signal circuit.

With a switching circuit having the aforementioned arrangement, the gate potential of the FET always varies with those of the source and drain. This prevents changes in the internal resistance of the FET in its conductive state, enabling large AC signal voltages to be transmitted without distorting the output signals.

According to the present invention, where there is used, for example, a junction type FET in the switching circuit, the aforementioned object is attained by passing current in the forward direction through the diode junctions defined by the gate with the source and drain of said FET. Accordingly, where there is used a metal oxide semiconductor (MOS) type FET in place of said junction type FET, it is necessary to connect to said MOS type FET at least one diode capable of an equivalent action to that of said diode junction.

Figure 2:
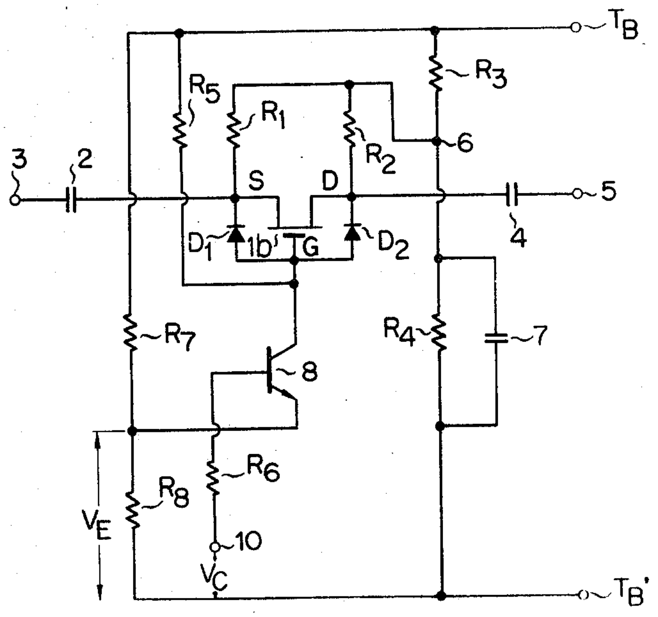

This invention can be more fully understood from the following detailed description when taken in connection with the accompanying drawing, in which:

FIG. 1 shows a muting circuit according to an embodiment of the present invention using a junction type FET; and FIG. 2 illustrates a muting circuit according to another embodiment of the invention using an MOS type FET.

Referring to FIG. 1, the source S of an N channel junction type FET 1a is connected to a signal input terminal 3 through a condenser 2, and the drain $D_2$ thereof to a signal output terminal 5 through a condenser 4. Between the terminals $T_B(+)$ and $T_B'$ of a DC source is disposed a voltage divider circuit consisting of resistors $R_3$ and $R_4$. The voltage dividing point 6 of said circuit is connected to the source S through a resistor $R_1$ and to the drain D through a resistor $R_2$. There is provided a condenser 7 connected in parallel to a resistor $R_4$. The gate G of the FET is connected to the terminal $T_B$ of the D.C. source through a high value resistor $R_5$. There is provided a separate voltage divider circuit consisting resistors $R_7$ and $R_8$ with a voltage drop in the resistor $R_8$ denoted as $V_E$. The collector of a transistor 8 is connected to the gate G, the emitter to one terminal 9 of the resistor $R_8$ and the base to a control signal input terminal 10 through a resistor $R_6$. The voltage value of control signals to be impressed across the terminal 10 and the terminal $T_B'$ of the D.C. source is designated as $V_C$.

According to the aforementioned arrangement, the gate G has a higher potential than those of the source S and drain D, so that small amounts of current pass in the forward direction through the diode junctions defined by the gate G with the source S and drain D to let the section between the source S and drain D be conductive. Accordingly, signals supplied to the signal input terminal 3 are conducted to the signal output terminal 5.

On the other hand, the activation or shut off of the transistor 8 is determined according to a voltage difference between the constant voltage $V_E$ and the voltage $V_C$ of control signals. Namely, the transistor 8 is put into operation (turned on) in the case of $V_C>V_E$ and shut off in the case of $V_C<V_E$. Where the transistor 8 is energized, the potential of the gate G drops approximately to the low level of $V_E$ to shut off the FET 1*a*, permitting no transmission of signals across the signal input and output terminals 3 and 5 of the muting circuit. Conversely where the transistor 8 is shut off, the potential of the gate G rises again to cause current to pass in the forward direction through the diode junctions, thereby maintaining a potential difference between the source S and gate G, as well as between the drain D and gate G, at a prescribed level. Namely, the potential of the gate G varies with those of the source S and drain D. Accordingly, there does not occur any change in the internal resistance of the FET, enabling high level signals to pass through the FET without distortion.

Where the muting circuit includes an MOS FET 1*b* shown in FIG. 2, it is only required to connect a diode $D_1$ between and source S and gate G or a diode $D_2$ between the drain D and gate G or to use both types of connection. In this case, said diodes $D_1$ and $D_2$ perform an equivalent action to that of the diode junctions of the aforesaid junction type FET. Namely, where the FET 1*b* is activated, current passes in the forward direction through said diode $D_1$ or $D_2$, causing the potential of the gate G to vary with those of the source S and drain D. Where the FET is in operation, the potentials of the source S and drain D present an extremely small difference, so that connection of either of the diodes $D_1$ and $D_2$ attains the object of the present invention.

It will be apparent that the present invention is not limited to the foregoing embodiment, but may be practised in various modifications. While there has been described an N channel type FET, it will be possible to use a P channel type FET if the FET is impressed with a voltage having an opposite polarity to that already described. Though the aforementioned embodiments relate to the case where the switching circuit of the present invention was used as a muting circuit in a receiving set to prevent the occurrence of noises therein, said circuit may also be used as a general electronic switch circuit.

What is claimed is:

1. A single junction type P-channel effect transistor AC signal switching circuit comprising:
   an AC signal circuit providing AC input signals;
   said field effect transistor having diode junctions between its gate and source and between its gate and drain, respectively, said AC signal circuit being connected in series with the source-drain circuit of said field effect transistor, said field effect transistor selectively passing said AC signals from said source to said drain;
   passive bias circuit means for biasing said source and drain electrodes, and for supplying a constant gate voltage to said gate relative to the source and drain voltage during the conductive period of said field effect transistor, said constant gage voltage being more negative than the minimum value of said AC signals for forcing diode current to flow through at least one of said diode junctions during said conductive period so that the gate voltage follows the AC source voltage, thereby passing said AC signals; and a control circuit coupled to said gate for selectively rendering said field effect transistor conductive or non-conductive as a function of the value of control signals, thereby switching said AC signals.

2. A switching circuit according to claim 1 wherein said control circuit comprises a voltage divider coupled to the d.c. supply source of said circuit, and a transistor switched according to a voltage difference between the output voltage of said voltage divider and the voltage of a control signal.

3. A junction type N-channel single field effect transistor AC signal switching circuit comprising:

an AC signal circuit providing AC input signals;

said field effect transistor having diode junctions between its gate and source and between its gate and drain, respectively, said AC signal circuit being connected in series with the source-drain circuit of said field effect transistor, said field effect transistor selectively passing said AC signals from said source to said drain;

passive bias circuit means for biasing said source and drain electrodes, and for supplying a constant gate voltage to said gate relative to the source and drain voltage during the conductive period of said field effect transistor, said constant gate voltage being more positive than the maximum value of said AC signals for forcing diode current to flow through at least one of said diode junctions during said conductive period so that the gate voltage follows the AC source voltage, thereby passing said AC signals; and a control circuit coupled to said gate for selectively rendering said field effect transistor conductive or non-conductive as a function of the value of control signals, thereby switching said AC signals.

4. A switching circuit according to claim 3 wherein said control circuit comprises a voltage divider coupled to the DC supply source of said circuit, and a transistor switched according to a voltage difference between the output voltage of said voltage divider and the voltage of a control signal.

* * * * *